(12) United States Patent
Ellis et al.

(10) Patent No.: US 6,580,650 B2
(45) Date of Patent: Jun. 17, 2003

(54) DRAM WORD LINE VOLTAGE CONTROL TO INSURE FULL CELL WRITEBACK LEVEL

(75) Inventors: Wayne F. Ellis, Jericho, VT (US); Russell J. Houghton, Essex Junction, VT (US); Mark D. Jacunski, Colchester, VT (US); Thomas M. Maffitt, Burlington, VT (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 138 days.

(21) Appl. No.: 09/810,325

(22) Filed: Mar. 16, 2001

(65) Prior Publication Data

US 2002/0159301 A1 Oct. 31, 2002

(51) Int. Cl.⁷ .................................................. G11C 7/00
(52) U.S. Cl. ................................... 365/189.09; 365/195
(58) Field of Search ............................ 365/189.09, 195, 365/230.06

(56) References Cited

U.S. PATENT DOCUMENTS

| | | | |
|---|---|---|---|
| 3,713,114 A | 1/1973 | Linton et al. | |
| 3,786,437 A | 1/1974 | Croxon et al. | |
| 4,031,522 A | 6/1977 | Reed et al. | |
| 4,574,365 A | 3/1986 | Scheuerlein | |
| 5,007,027 A | 4/1991 | Shimoi | |
| 5,295,100 A | 3/1994 | Starkweather et al. | |
| 5,396,464 A | 3/1995 | Slemmer | |
| 5,410,508 A | 4/1995 | McLaury | |
| 5,553,028 A | 9/1996 | McLaury | |
| 5,625,315 A | 4/1997 | Matsui et al. | |
| 5,748,534 A | * 5/1998 | Dunlap et al. | 365/185.21 |
| 5,805,509 A | 9/1998 | Leung et al. | |
| 5,909,407 A | 6/1999 | Yamamoto et al. | |
| 5,926,433 A | 7/1999 | McLaury | |
| 6,034,886 A | 3/2000 | Chan et al. | |

* cited by examiner

Primary Examiner—Vu A. Le
(74) Attorney, Agent, or Firm—Schmeiser, Olsen & Watts; Steven Capella

(57) ABSTRACT

A DC analog circuit which monitors a DRAM sample cell access device and outputs a DC reference voltage to the word line voltage regulation system. The resulting output voltage $V_{pp}$ from the word line voltage regulation system will then vary in accordance with the cell access device parametrics so as to guarantee a full high level will always be written into the DRAM cell.

28 Claims, 10 Drawing Sheets

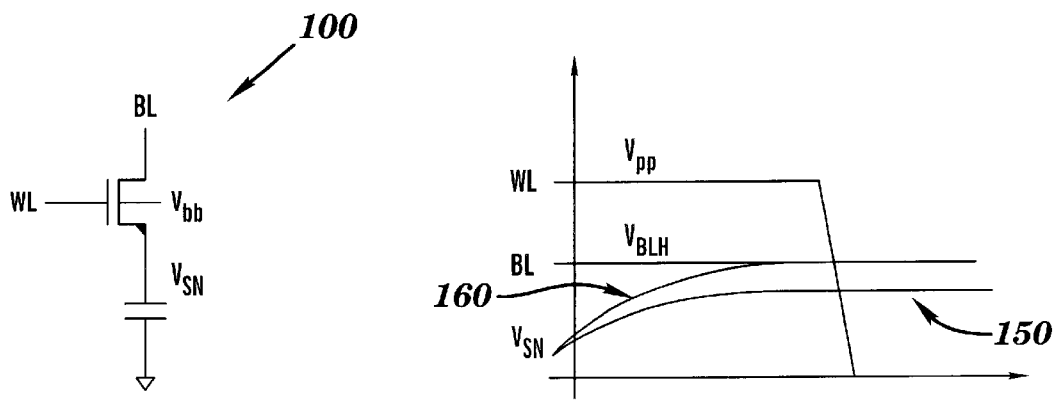
FIG. 1A
*RELATED ART*
FIG. 1B
*RELATED ART*
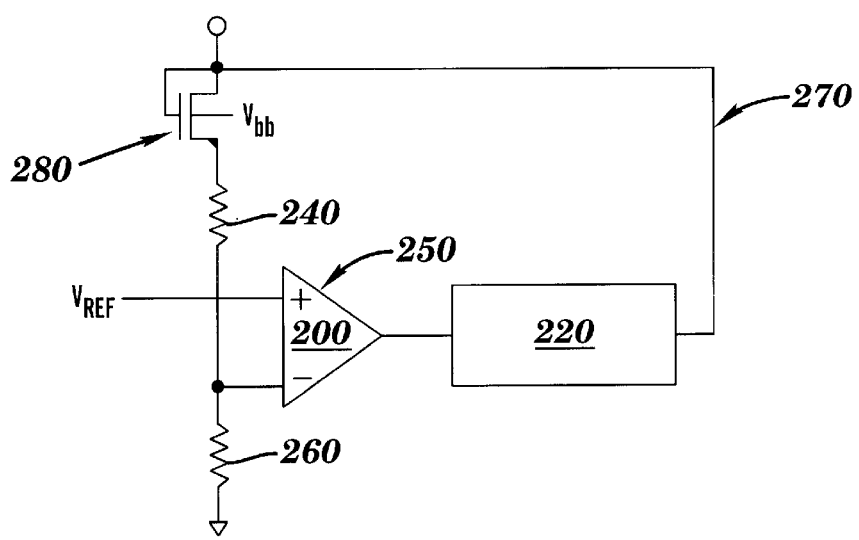
FIG. 2
*RELATED ART*

DRAM WORD LINE VOLTAGE CONTROL TO INSURE FULL CELL WRITEBACK LEVEL

BACKGROUND OF THE INVENTION

1. Technical Field

A DC analog circuit is disclosed which monitors a dynamic random access memory (DRAM) sample cell access device, and outputs a DC reference voltage to a word line voltage regulation system. The resulting output voltage, $V_{pp}$, from the word line voltage regulation system, will then vary in accordance with the cell access device parametrics to guarantee that a full high-level voltage will always be written into the DRAM cell.

2. Related Art

A typical DRAM must operate within the framework of the overall system timing and global bus scheduling. Therefore, the DRAM architecture as well as individual memory cell designs are closely tied to timing issues.

The global bus serves as both the address bus and the data bus. One consequence of this arrangement is that a read or write operation to the DRAM memory core takes exactly two system clock cycles. In the first, or address, cycle, the read/write memory address is presented on the global bus and is latched in by the address register on the DRAM chip. In the second, or data, cycle, the DRAM receives the write enable control bit and the write data (if any). During this second cycle, data is either written to, or read from, the memory core and subsequently presented on the global bus.

A refresh cycle, however, operates somewhat differently. During a refresh cycle, an internally generated row address selects a row in the memory to be refreshed. In column-wise parallel fashion, the (inverted) row data is read out, inverted by the refresh circuitry, and then written back into the same row. To ensure device reliability, the voltage level of this write back signal must be both of a sufficient amplitude and free of ripple or other induced noise. The column and row addresses may be either loaded separately, on sequential clock cycles, or they may be presented at the same time.

One problem faced by DRAM designers is to select a sample cell access device circuit 100 having a word line WL voltage, $V_{pp}$, (FIGS. 1A, 1B) that is adequately high to achieve a full writeback level in the cell when the cell access device is weak (i.e., there are a high threshold voltage ($V_t$), a long channel, a narrow width, and a thicker oxide), while at the same time not exceeding the breakdown voltage of the dielectric material in the cell structure. One common solution is to fix the word line voltage $V_{pp}$ as high as possible near the reliability limits of the technology. In process cases where the cell access device is weak, this fixed voltage solution is inadequate. The cell writeback signal will fall short of its bitline "high" voltage ($V_{BLH}$) goal, as illustrated in FIG. 1B by voltage curve 150.

An improvement sought by many designers involves monitoring a sample cell access device and automatically adjusting the word line voltage, $V_{pp}$, to a level which tracks the threshold fluctuations of the cell device, at a minimum, to insure that it is always conductive when the source is at bitline potential. Curve 160 in FIG. 1B illustrates this concept. The advantages of such an improved method would be a lower nominal word line voltage giving rise to better reliability and lower current consumption from the word line voltage regulation system.

Another approach that has been attempted in the related art is illustrated in FIG. 2. A diode-connected sample cell access device 280 is installed in the feedback path 270 of the $V_{pp}$ word line voltage system monitor 250, as shown in FIG. 2. This approach, however, has several disadvantages. First, the drain and source voltages of the sample cell access device 280 do not correspond to the actual operating drain and source voltages of the cell device 280 near the end of writeback of a "high" level. Also, the resistive divider formed by resistors 240 and 260 attenuates the sample cell access device 280 process fluctuations, thereby reducing compensation effectiveness. Yet another disadvantage arises because the sample cell access device 280 must operate at low microampere (e.g., approximately 1 to 5 $\mu A$) current levels in order to mimic the actual cell charging current. Microampere currents transform into an impedance level, of the combined device and resistive divider 240, 260, in the several hundred thousand ohms range. This high impedance, combined with unavoidable stray capacitance, slows the response time of the feedback loop 270, in turn causing excessive overshoot of the $V_{pp}$ goal voltage before the charge pump 220 shuts off. This effect produces an unacceptably high ripple voltage on $V_{pp}$.

An improved prior art method taught by Foss et al. (U.S. Pat. No. 5,267,201, incorporated herein by reference) utilizes the sample cell access NFET device 350 in the feedback loop in a different manner, as shown in FIG. 3. PFET devices 360 and 370 comprise a current mirror connected between $V_{pp}$ and the drain of sample cell access device 350 to sense its current. The current mirror drives the drain of NFET device 380 operating in the linear region as a resistive load and outputs a voltage to drive the inverters 410 and 420 to produce a logic level inhibit signal for switching the oscillator 440 on and off. The Foss circuit realizes two advantages over the approach embodied by the circuit of FIG. 2. First, the source of NFET device 350 is properly referenced to the bitline high voltage $V_{dd}$ (same as $V_{BLH}$) as desired, and secondly, $V_{pp}$ must achieve a high enough voltage for current to flow in NFET device 350 before an inhibit signal can be generated.

Although Foss has taught improvements, the circuit (FIG. 3) still suffers drawbacks. One drawback is the sample device current variation with the drain voltage set by diode-connected PFET 360 which has its own parametric fluctuations unrelated to the memory cell device. Sensitivity to this effect will be significantly magnified in very short channel (i.e. approximately 0.15 microns) modern DRAM technologies compared to the technology of the Foss era. Also, current through NFET device 350 that triggers an inhibit signal compares to the strength of the linear region NFET device 380. Again, parametric variations of NFET device 380 will also influence the $V_{pp}$ level unrelated to the cell device.

Increasing load current demand on the $V_{pp}$ regulation system of modern day synchronous DRAMs (SDRAMs) presents a tougher design challenge especially if decoupling capacitance is limited. Stronger charge pumps combined with limited decoupling capacitance require faster transient response from the $V_{pp}$ level monitor to suppress $V_{pp}$ ripple. Foss's approach still relies on a sample cell access device located in the feedback loop contrary to the fast transient response requirement.

SUMMARY OF THE INVENTION

The present invention discloses a circuit and method which overcome all of the related art disadvantages, while at the same time achieving more precise control of $V_{pp}$ and guaranteeing a full cell writeback level. This circuit overcomes the major loop response problem of the related art by avoidance of the sample memory cell access device in the feedback loop of the $V_{pp}$ regulation system. Instead the sample cell access device is operated in a circuit under steady state DC conditions and outputs a DC reference voltage that changes in accordance with the parametrics of the sample memory cell access transistor. This DC reference voltage then becomes the reference supplied to the $V_{pp}$ level monitor in the $V_{pp}$ voltage regulation system.

The present invention provides a method of biasing and monitoring a sample cell access device for regulating the word line selection voltage of a dynamic random access memory (DRAM) chip, said method comprising: providing a sample cell access device wherein said sample cell access device substantially tracks the process parametric fluctuations of any one of a plurality of memory cell access devices within the DRAM chip; forcing a constant DC current through said sample cell access device; providing a DC voltage equal to the bitline selected voltage applied to a first terminal of said sample cell access device; and providing an amplifying circuit connected between the gate terminal and a second terminal of said sample cell access device for regulating the voltage at the second terminal of said sample access device at a predetermined voltage less than the bitline selected voltage wherein said amplifying circuit outputs a reference voltage.

The present invention also provides a word line voltage control circuit for monitoring a sample cell access device and regulating a word line voltage selection level of a dynamic random access memory (DRAM) cell, said word line voltage control circuit comprising: a sample cell access device; a circuit for forcing a fixed current through said sample cell access device; an amplifier circuit connected to the output of said sample cell access device; a feedback loop between said amplifier circuit and an input of said sample cell access device; and an output from said amplifier circuit to said word line of a dynamic random access memory (DRAM) cell.

The present invention further provides a method of employing a word line voltage control circuit for monitoring a sample cell access device and regulating a word line voltage selection level of a dynamic random access memory (DRAM), said method comprising: providing a word line voltage control circuit; providing a sample cell access device; forcing a fixed current through said sample cell access device; providing an amplifier circuit connected to the output of said sample cell access device; providing a feedback loop between said amplifier circuit and an input of said sample cell access device; and providing an output from said amplifier circuit to said word line of a dynamic random access memory (DRAM) cell.

The present invention additionally provides a word line voltage control circuit for monitoring a sample cell access device and regulating a word line voltage selection level of a dynamic random access memory (DRAM) cell, said word line voltage control circuit comprising: a sample cell access device; a circuit for forcing a fixed current through said sample cell access device; an inverting amplifier connected to the output of said sample cell access device; a level monitor connected to the output of said inverting amplifier; a charge pump connected to the output of said level monitor; a feedback loop between said charge pump and an input of said sample cell access device; and an output from said feedback loop to said word line of a dynamic random access memory (DRAM) cell.

The present invention further provides a method of employing a word line voltage control circuit for monitoring a sample cell access device and regulating a word line voltage selection level of a dynamic random access memory (DRAM), said method comprising: providing a word line voltage control circuit; providing a sample cell access device; forcing a fixed current through said sample cell access device; providing an inverting amplifier connected to the output of said sample cell access device; providing a level monitor connected to the output of said inverting amplifier; providing a charge pump connected to the output of said level monitor; providing a feedback loop between said charge pump and an input of said level monitor; and providing an output from said feedback loop to said word line of a dynamic random access memory (DRAM) cell.

The present invention still further provides a dynamic random access memory (DRAM) word line supply comprising: a voltage supply $V_{pp}$ increasing from a voltage level insufficient to enable a memory cell access transistor for the word line toward a voltage level sufficient to enable said access transistor, for connection to the word line from time to time; the memory cell access transistor for connecting a memory cell capacitor to a bitline, having a gate connected to the word line; a sample transistor similar to the memory cell access transistor; a circuit for applying the increasing voltage supply to the sample transistor for causing the sample transistor to conduct, under voltage supply conditions similar to those required by the memory cell access transistor; a circuit for prohibiting increase of the voltage supply upon turn-on of the sample transistor; whereby the voltage supply having the voltage level sufficient to turn-on the memory cell access transistor is provided for connection to the word line.

The present invention also provides a semiconductor structure including a word line voltage control circuit for monitoring and regulating a voltage signal to a word line of a dynamic random access memory (DRAM) cell, said semiconductor structure comprising: a substrate; at least one access transistor on said substrate; at least one buried node electrically coupled to said access transistor; at least one monitor transistor electrically coupled to said buried node; and an access transistor bitline connection electrically coupled to said buried node.

The present invention provides a word line voltage control circuit for monitoring and regulating a voltage signal to a word line of a dynamic random access memory (DRAM) cell, said word line voltage control circuit comprising: a compensated reference voltage system; and a word line voltage regulation system.

The present invention additionally provides a word line voltage control circuit for monitoring a sample cell access device and regulating a word line voltage selection level of a dynamic random access memory (DRAM) cell, said word line voltage control circuit comprising: a sample cell access device; a comparator circuit for comparing a reference voltage output of the sample cell access device with a fixed reference voltage; at least one charge pump connected to the output of said sample cell access device, said at least one charge pump receiving an input from said comparator circuit; a feedback loop between said charge pump and an input of said sample cell access device; and an output from said feedback loop to said word line of a dynamic random access memory (DRAM) cell.

BRIEF DESCRIPTION OF THE DRAWINGS

A better understanding of the invention will be obtained by reference to the detailed description below, in conjunction with the following drawings, in which:

FIG. 1A is a schematic DRAM cell writeback circuit with a fixed $V_{pp}$ level of the related art;

FIG. 1B is a graphical representation of the operating characteristics and performance of the circuit of FIG. 1A;

FIG. 2 is a partly schematic and partly block diagram diode connected cell access device of the related art;

DETAILED DESCRIPTION OF THE INVENTION

Figure 4B:
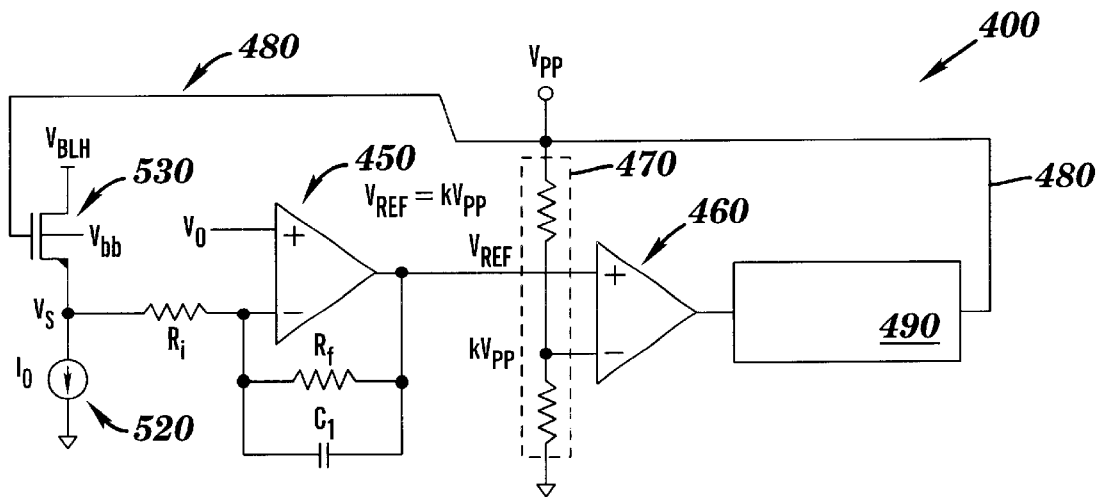
FIG. 4B is a partly schematic and partly block diagram illustration of a $V_{pp}$ voltage control system of the present invention.
Figure 5A:
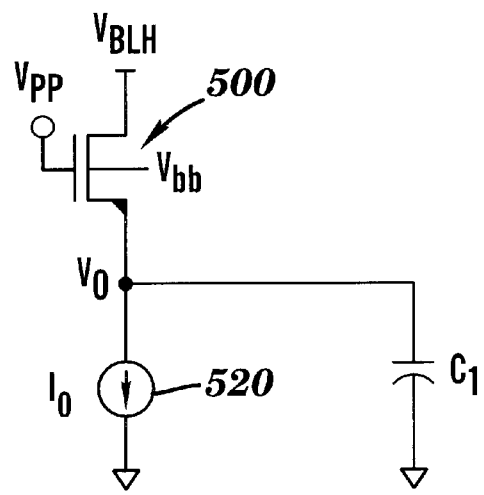
FIG. 5A is a schematic diagram of a sample device bias conditions and compensated writeback circuit of the present invention.
Figure 5B:
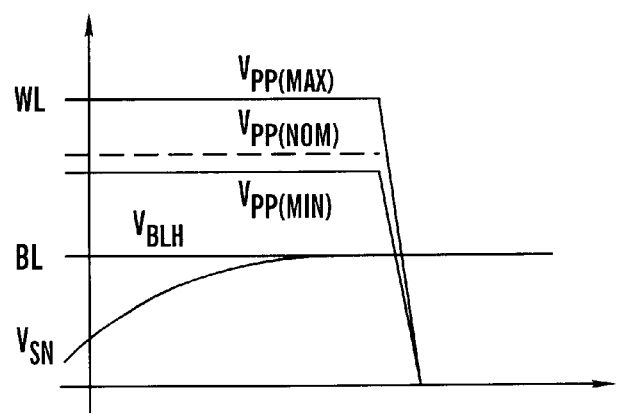
FIG. 5B is a graphical representation of the operating characteristics and performance of the circuit of FIG. 5A.

FIG. 5A shows a sample memory cell access device 500 with $V_{BLH}$ (bitline "high" voltage) applied at the drain, $V_0$ applied at the source, and a forced drain reference current, $I_0$, supplied by a reference current source 520 which is connected to ground in parallel with capacitor $C_1$. $V_0$ is a selected voltage close to $V_{BLH}$, (i.e., about 0.9 $V_{BLH}$), and $I_0$ is a current approximating the cell capacitor charging current near the end of writeback. For a given set of device parametrics, there is only one value of $V_{pp}$ that can satisfy these forced conditions. As device parametrics fluctuate, so too will $V_{pp}$ fluctuate, as illustrated by FIG. 5B, to maintain the forced conditions. Therefore, nearly full writeback to the cell access device 500 can be expected as shown in FIG. 5B because the actual cell access device 500 will also supply the same reference current $I_0$ when the cell capacitor $C_f$ (FIG. 4B) is charged to the same source voltage at 0.9 $V_{BLH}$.

Figure 3:
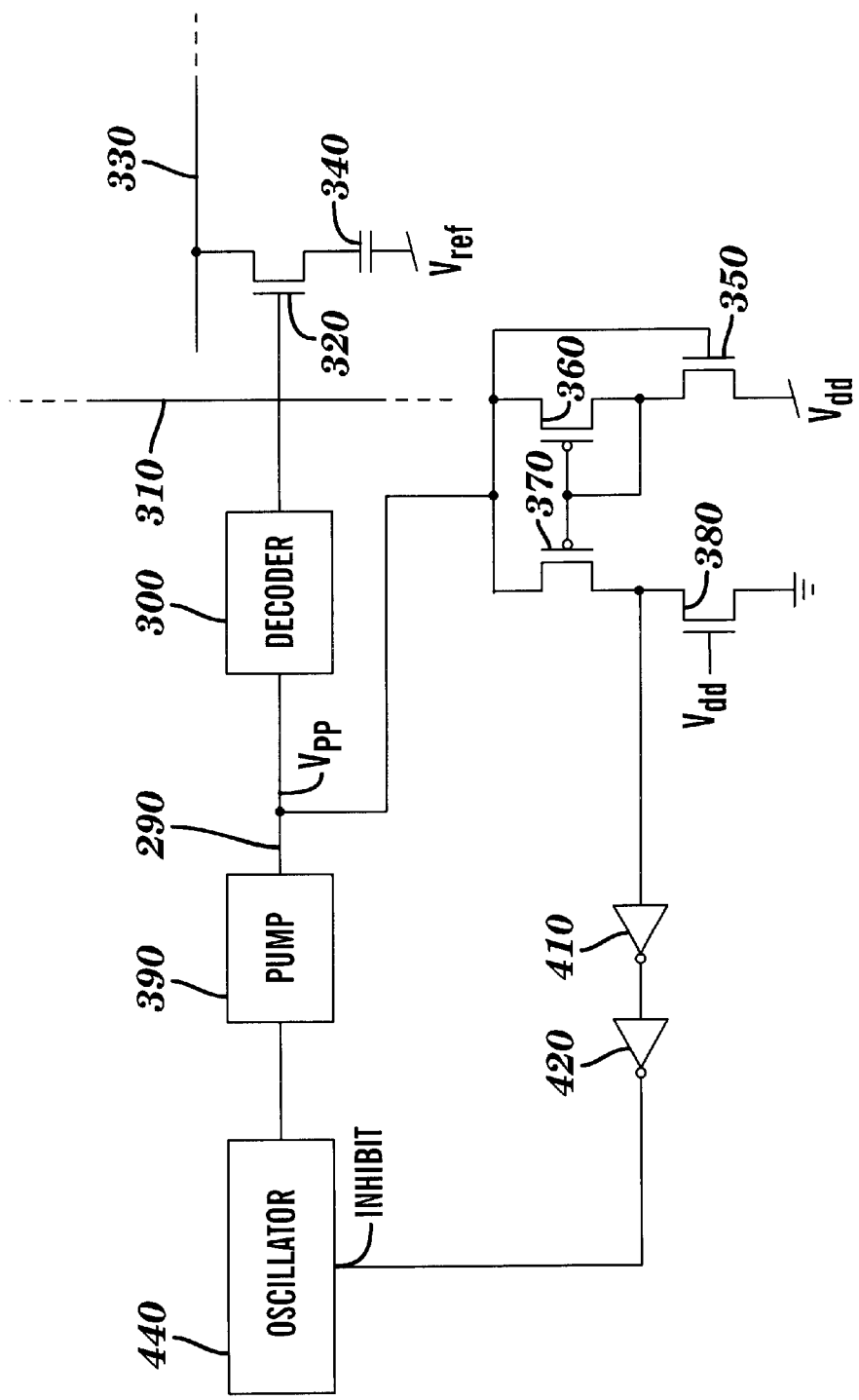
FIG. 3 is a partly schematic and partly block diagram illustration of an embodiment of a related art high voltage boosted word line supply charge pump regulator for DRAM.
Figure 4A:
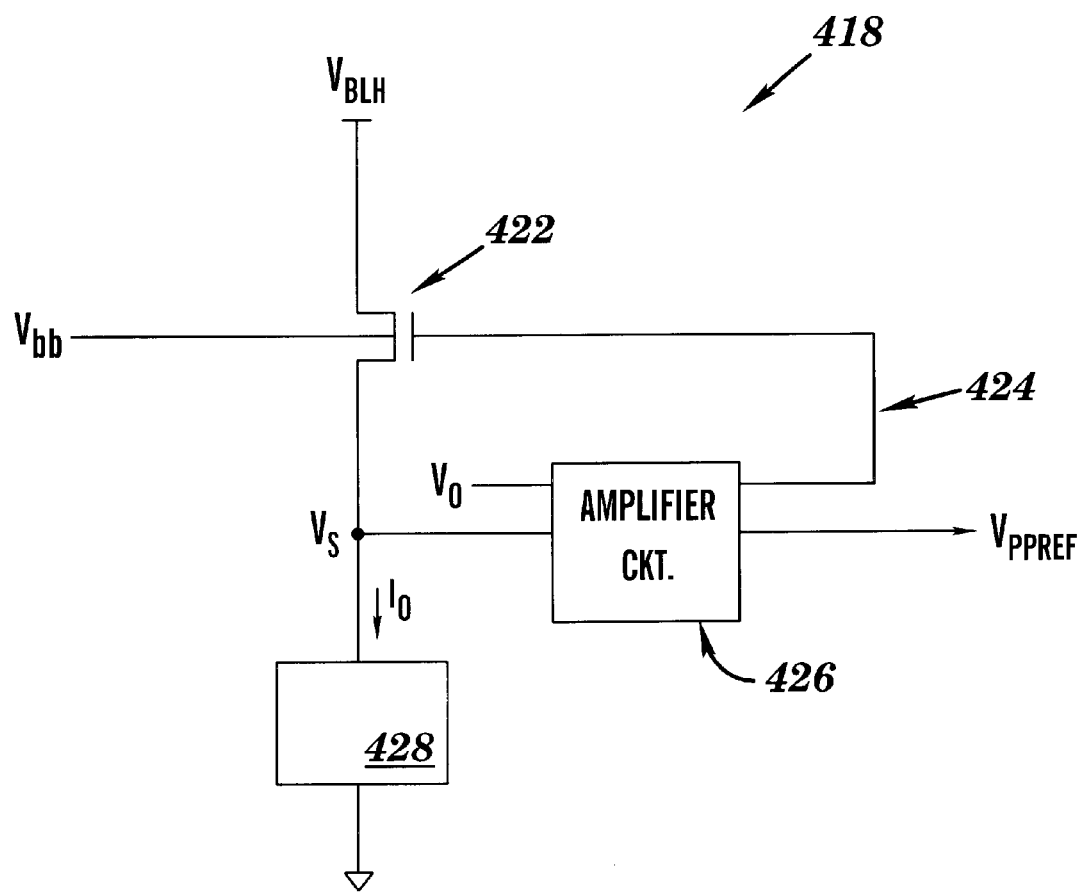
FIG. 4A is a partly schematic and partly block diagram illustration of a $V_{pp}$ voltage control system, with an amplifier circuit, of the present invention.

The circuit of FIG. 4A represents a word line voltage control circuit 418 for monitoring a sample cell access device 422 of a DRAM cell according to the present invention. The word line voltage control circuit 418 includes the sample cell access device 422, an amplifier circuit 426, a feedback loop 424, and a reference current source 428.

The word line voltage control circuit 418 of FIG. 4A operates as follows to produce the conditions described above. The drain of the sample cell access device 422 is connected to $V_{BLH}$ and the source voltage $V_S$ is controlled by a feedback loop 424 to be approximately equal to $V_0$, while the drain current $I_0$ is forced by the reference current source 428. An amplifier circuit 426 outputs voltage signal $V_{PPREF}$.

An alternative embodiment is shown in the circuit 400 of FIG. 4B. Circuit 400 operates as follows. The sample cell access device 530 drain is connected to $V_{BLH}$ and the source voltage $V_S$ is controlled by feedback to be approximately equal to $V_0$, while the drain current $I_0$ is forced by the reference current source 520. An inverting amplifier 450 outputs voltage signal $V_{REF}$ to the positive input of a conventional voltage comparator level monitor 460. The negative input of voltage comparator level monitor 460 is fed voltage signal of amplitude $kV_{pp}$ by the resistive divider 470 coupled to $V_{pp}$ and having voltage gain k as shown. A feedback loop 480 is formed that includes the sample cell access device 530, the inverting amplifier 450, the $V_{pp}$ voltage regulation system (resistive divider 470, comparator level monitor 460, and charge pump 490) and the feedback path 480 via $V_{pp}$ back to the sample cell access device 530. This feedback loop 480 responds very slowly compared to the feedback loop 540 within the $V_{pp}$ regulation system. The compensating capacitor $C_f$ forces this slow response and insures feedback loop stability.

Figure 4C:
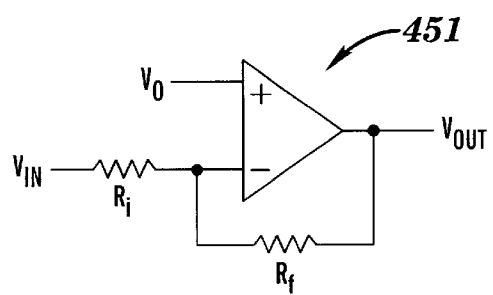
FIG. 4C is a schematic diagram of a typical inverting amplifier.

The calculations presented below, taken in conjunction with FIGS. 4B and 4C, clearly show how the circuit 400 operates to control $V_{pp}$ in response to process fluctuations of the sample cell access device 530. The typical inverting amplifier 451 of FIG. 4B has the characteristic gain equation which can be used to express the input voltage $V_{in}$ as a function of the output voltage $V_{out}$:

$$V_{in} = V_0 + \frac{R_i}{R_f}(V_0 - V_{out}) \qquad (Eq. 1)$$

Equation 1 is used to calculate the sample cell access device 530 source voltage $V_S$ as a function of $V_{pp}$ as shown Equation 2:

$$V_S = \left[V_0 + \frac{R_i}{R_f}(V_0 - kV_{pp})\right] \qquad (Eq. 2)$$

Using the familiar ideal field effect transistor (FET) linear formula (Eq. 3) for drain current $I_d$:

$$I_d = k_n \frac{w}{L}\left(V_{gs} - V_T - \frac{V_{ds}}{2}\right)V_{ds} \qquad (Eq. 3)$$

and substituting $V_S$, yields the expression for $V_{pp}$ derived from the ideal FET linear shown in equation 4:

$$I_0 = k_n \frac{w}{L}\left\{V_{pp} - \left[V_0 + \frac{R_i}{R_f}(V_0 - kV_{pp})\right] - \right.$$

$$\left. V_T - \frac{V_{BLH} - \left[V_0 + \frac{R_i}{R_f}(V_0 - kV_{pp})\right]}{2}\right\}$$

$$\left(V_{BLH} - \left[V_0 + \frac{R_i}{R_f}(V_0 - kV_{pp})\right]\right) \qquad (Eq. 4)$$

Equation 4 can be solved explicitly for $V_{pp}$ under the following simplifying assumptions. The difference between $V_0$ and $kV_{pp}$ is typically no higher than 0.25V. If the amplifier gain determined by $R_F/R_1$ is made high (i.e., >10), then the term $R_1/R_F(V_0-kV_{pp})$ in this expression (Eq. 4) is a small error voltage (i.e., approximately zero) that can be neglected, and the expression (Eq. 4) is then simplified to the form of Equation 5:

$$I_0 = k_n \frac{W}{L}\left\{V_{pp} - V_0 - V_T - \frac{V_{BLH} - V_0}{2}\right\}(V_{BLH} - V_0) \quad \text{(Eq. 5)}$$

Equation 5 can then be solved for $V_{pp}$ as shown in Equation 6:

$$V_{pp} = \frac{I_0}{k_n \frac{W}{L}(V_{BLH} - V_0)} + V_0 + V_T + \frac{V_{BLH} - V_0}{2} \quad \text{(Eq. 6)}$$

The parameters $V_{BLH}$, $V_0$ and $I_0$ are known constants. Therefore, $V_{pp}$ varies only in accordance with the sample memory cell access device parameters, specifically VT and a process transconductance parameter $K_n$.

Figure 6:
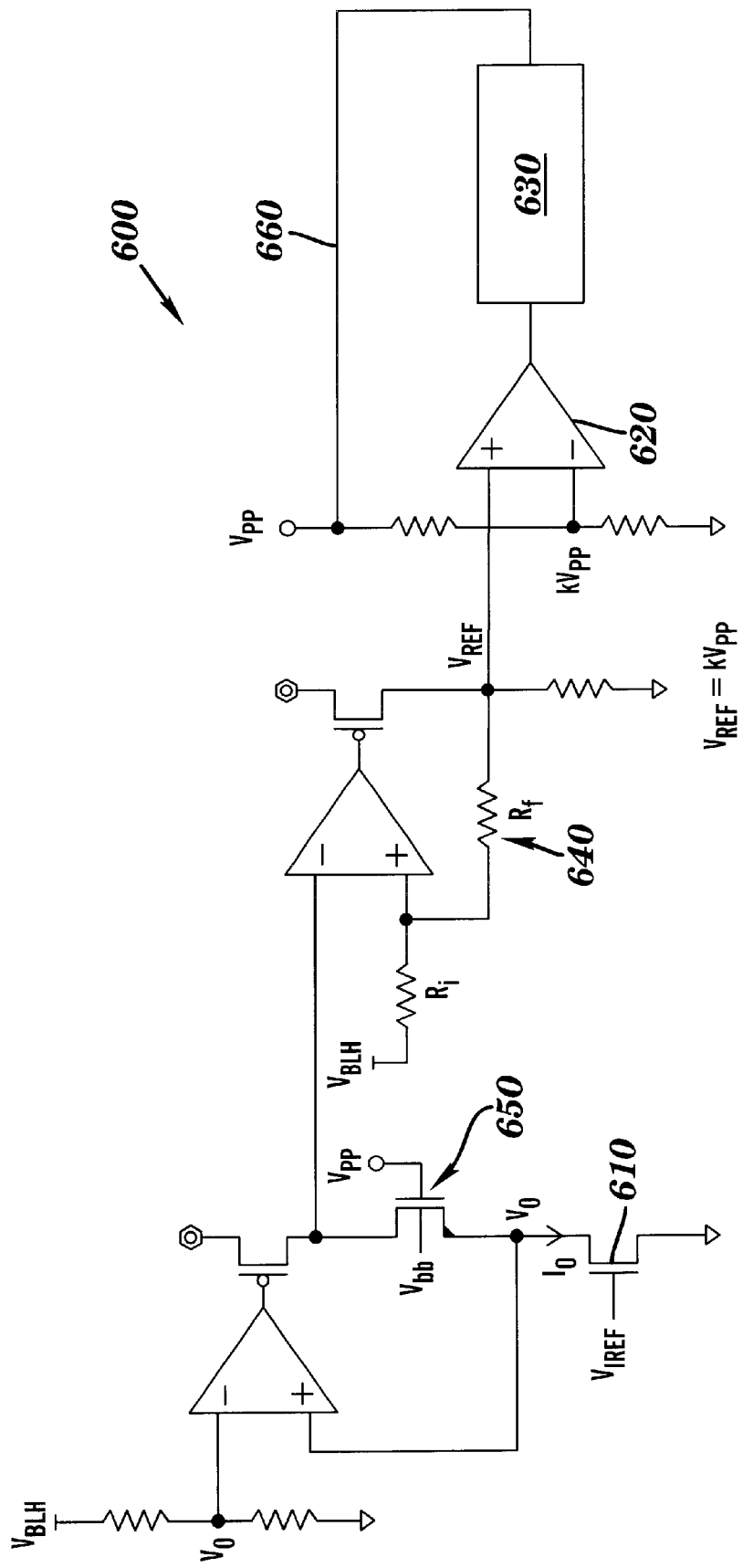
FIG. 6 is a partly schematic and partly block diagram illustration of an alternate embodiment of the present invention.

Although the circuit 400 presented in FIG. 4B has been described supra, alternative circuit embodiments are possible which practice the principles of the invention. One such embodiment is shown in circuit 600 of FIG. 6. A feedback amplifier 640 regulates the source of the sample cell access device 650 at $V_0$ and the reference current $I_0$ source 610 forces the drain current. A charge pump 630 is included in the feedback loop 660. The drain voltage is set at a voltage equal to approximately $kV_{pp}$ by the amplifier 640 having gain $R_F/R_1$ as in the example illustrated in FIG. 4B, supra.

Figure 7A:
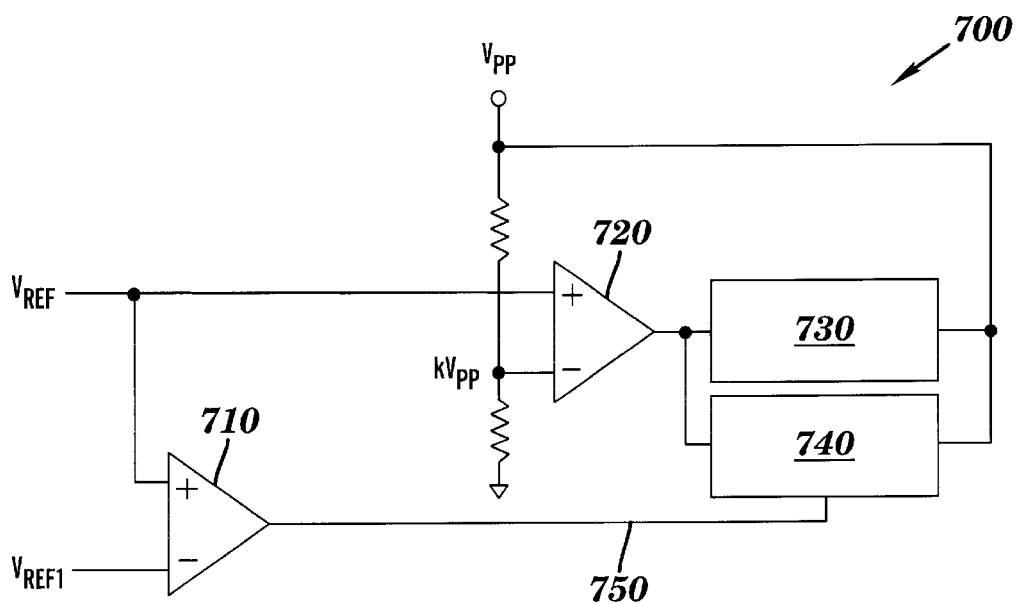
FIG. 7A is a partly schematic and partly block diagram illustration of a digital pump selection based on $V_{pp}$ reference.
Figure 7B:
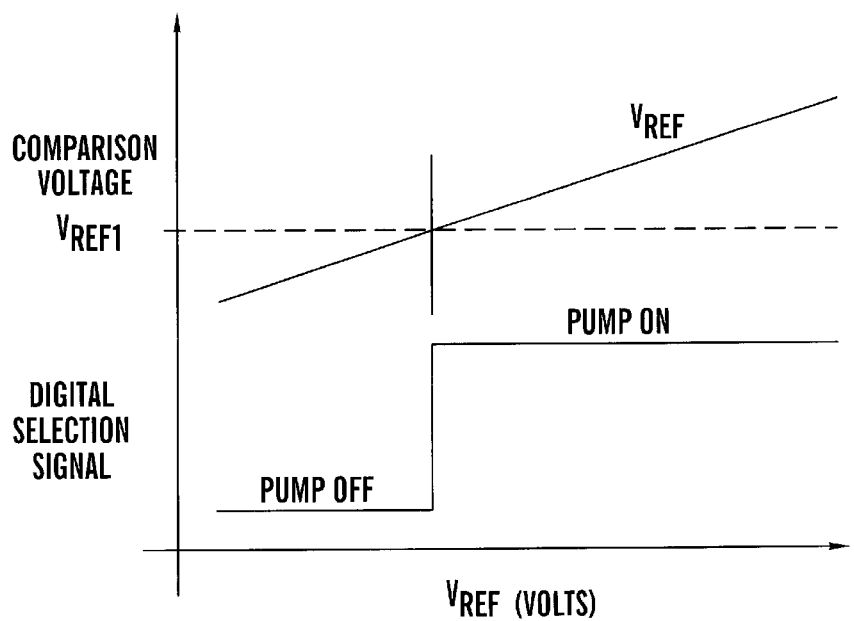
FIG. 7B is a graphical representation of the operating characteristics and performance of the circuit of FIG. 7A.

One of the characteristics of a $V_{pp}$ pump system is that its current drive capacity increases linearly as $V_{pp}$ decreases. This characteristic presents a problem when $V_{pp}$ is allowed to vary with sample cell access device parametrics. At the maximum expected $V_{pp}$ voltage, sufficient pump capacity must be provided to support this voltage under load. At the other extreme, when $V_{pp}$ is at its minimum, the pump delivers significantly higher current. Given a constant delay through the level monitor and higher pump capacity translates to higher overshoot of the goal $V_{pp}$ voltage. Therefore, $V_{pp}$ ripple will increase under this condition calling for lower pump strength to keep ripple under control. Referring now to FIG. 7A, one aspect of the disclosed circuit 700 of the present invention is that the sample cell access device 720 operates in a static circuit, unlike the related art. The DC reference voltage output $V_{REF}$ of the disclosed circuit can be compared to a fixed DC reference $V_{REF1}$ by a comparator circuit 710 as shown graphically in FIG. 7B. The comparator circuit 710 outputs a digital selection signal 750, which is used to deselect a fraction of a plurality of charge pumps 730, 740 to reduce overall pump capacity. Although FIG. 7A shows only one comparison reference voltage ($V_{REF1}$) circuit 710, it is an obvious extension of the inventive concept to provide for finer pump strength control by providing a plurality of such comparison reference voltages.

The device structure used to monitor the geometric and process dependent variables that influence the positioning of $V_{pp}$ is shown in FIGS. 8A, 8B and 9A, 9B. The goal of the device structure is to mimic the actual array device through a sample transistor as described supra.

Figure 8A:
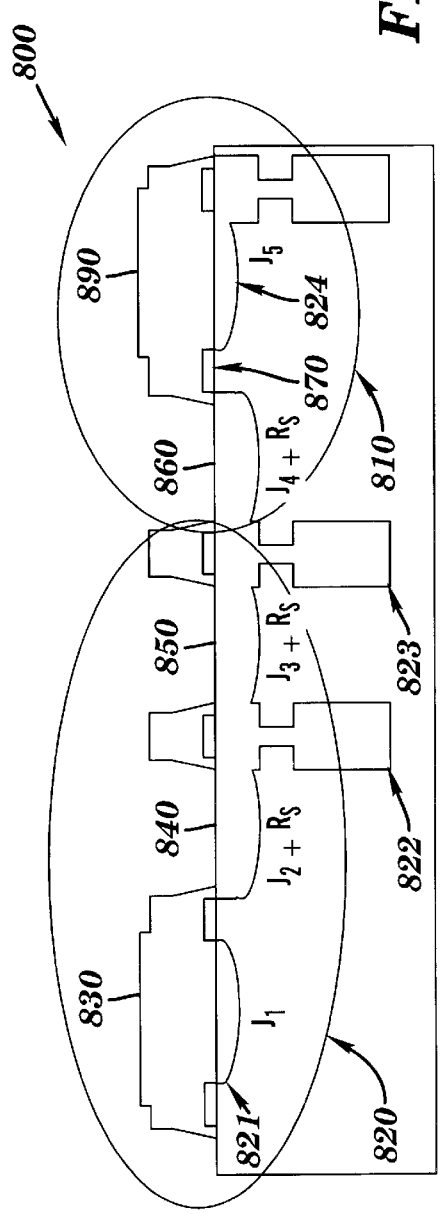
FIG. 8A is a cross-sectional view of a semiconductor embodiment of back to back sample transistors of the present invention.
Figure 8B:
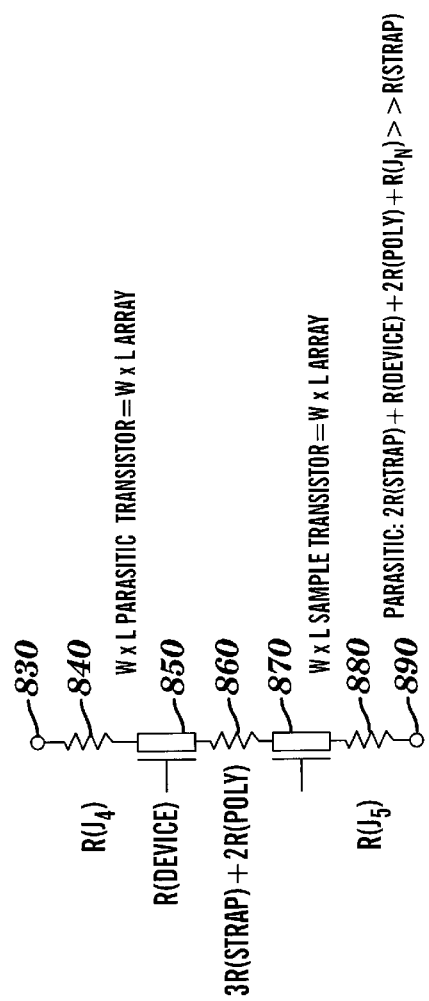
FIG. 8B is a schematic diagram of the embodiment of FIG. 8A.

FIGS. 8A and 8B show an implemented monitoring scheme 80. In FIG. 8A, both the sample transistor 810 geometric and process dependent variables are identical to the actual array transistor, but in order to access the transistor, a series parasitic device 820 is required to be located in the path of the sample transistor 810. This series parasitic device 820 in conjunction with the added parasitic array strap (i.e., the capacitor node connection from the access transistor) adds a large series resistance component which negates its usefulness as a $V_{pp}$ calibration tool. Estimates indicate that this added resistance is approximately 80 KΩ (i.e., 60 kΩ due to the parasitic device and 20 kΩ due to the parasitic extrinsic resistance to connect the sample and parasitic transistors in series). Also, the parasitic transistor 820 must be turned on in order to measure the sample transistor 810, and the geometric and process dependent variables that affect the sample transistor 810 are effectively doubled, and would produce an erroneous choice when establishing $V_{pp}$ voltage levels. Although this embodiment describes a trench capacitor cell, this technique also works for a stacked capacitor cell wherein the storage capacitor is above the silicon substrate. That is, the structure depicted in FIG. 8A can be inverted to produce a structure having the storage capacitor above the silicon substrate.

The parasitic transistor 820 has a first bitline contact 830, which is connected to a first diffusion region 821 which includes a diffusion junction ($J_1$). A second diffusion region 840, has a second diffusion junction ($J_2$) and a first outdiffused buried strap resistance $R_{S1}$ (from the storage cell to the actual transistor). Also located in the parasitic transistor 820 is a transistor device 850. Device 850 similarly has a third diffusion junction ($J_3$) and a second outdiffused buried strap resistance $R_{S2}$. Device 850 is located over polysilicon-filled isolation trenches 822 and 823. The strap resistances $R_{S1}$, $R_{S2}$ are formed adjacent to their respective trenches by out-diffusion from the polysilicon material in the trenches using known techniques.

The sample transistor 810 has a second bitline contact 890, which is in turn connected to a fifth diffusion region 824, which includes a diffusion junction ($J_5$). A fourth diffusion region 860, has a fourth diffusion junction ($J_4$) and a third outdiffused buried strap resistance $R_{S3}$ (from the storage cell to the actual transistor). Also located in the sample transistor 810 is a transistor device 870.

The cross-sectional embodiment illustrated in FIG. 8A is represented schematically in FIG. 8B. Bitline contact 830 is connected to resistor 840 which represents the resistance of the first diffusion junction $J_1$. Device 850 represents the actual parasitic transistor 850 which has its own inherent voltage-dependent resistance $R_{device}$. Note that the width W and length L of the parasitic transistor 850 are approximately equivalent to the width and length of the array device. Resistor 860 symbolizes the resistance of the three strap resistances $R_{S1}$, $R_{S2}$, $R_{S3}$ and the two polysilicon resistances $R_{poly1}$, $R_{poly2}$. Device 870 represents the sample transistor 810. Similar to the parasitic transistor, the width W and length L of the sample transistor 810 are approximately equivalent to the width and length of the array device. Finally, resistor 880 represents the resistance of the fifth diffusion junction $J_5$.

From this schematic arrangement, a relationship can be defined between the parasitic device's resistance and the strap resistance:

$$2R_{strap} + R_{device} + 2R_{poly} + R_{jn} >> R_{strap}$$

Figure 9A:
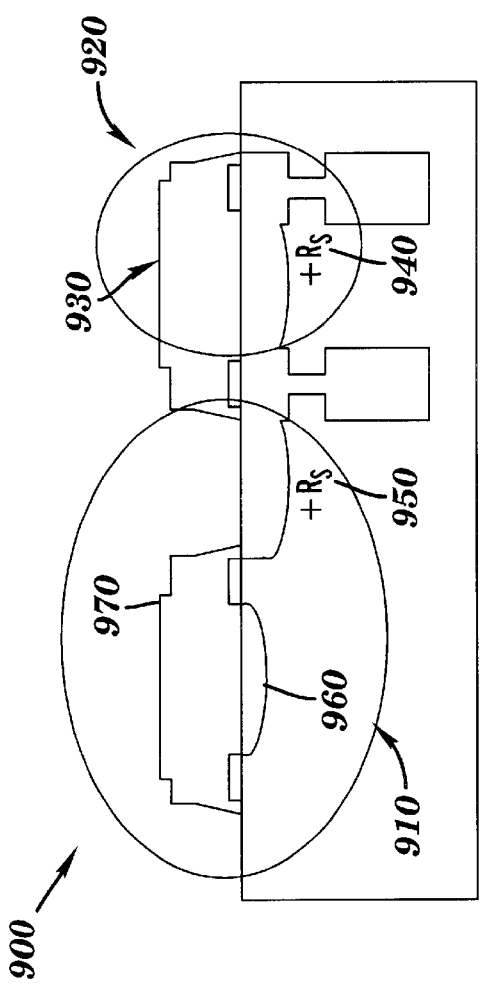
FIG. 9A is a cross-sectional view of a semiconductor embodiment of a single sample transistor of the present invention.
Figure 9B:
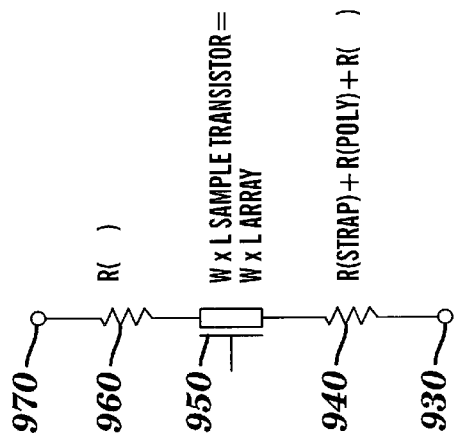
FIG. 9B is a schematic diagram of the embodiment of FIG. 9A.

FIGS. 9A and 9B show another embodiment of a monitoring scheme. In this embodiment 900, a single sample transistor 910 is embedded in a DRAM mini-array (as was the case also in FIGS. 8A and 8B barring the back-to-back device connection), and as such contains the statistical nominal information on geometric and process dependencies necessary to provide the information required to set a nominal $V_{pp}$ voltage. In order to implement the sample transistor 910 monitoring, a bitline contact is moved from its normal array pattern as shown in FIG. 8 (CB Bitline 2 890) to the pattern indicated in FIG. 9A (CB Bitline 2 930). In the sample transistor mini-array layout, the neighboring array transistor bitline contacts would be eliminated to provide access to the new contact 930 (CB Bitline 2). All other sample transistor patterns are "regular" including the geometric dependencies of the deep trench, W and L transistor properties, proximity effects (e.g., polysilicon to polysilicon gate conductor space) and process dependencies, (e.g., gate oxide (Tox) growth, channel dopant implants, junction implant, bitline and node side) and the very important asymmetric feature that is both geometric and process dependent (i.e., the buried strap outdiffusion [determines $R_{strap}$] from the deep trench).

The sample transistor mini-array layout can also include a data sampling system (not shown) which are used to provide data for statistical analysis and subsequent access transistor monitoring and control.

The connection through the node contains two additional parasitic elements. One element is $R_{poly}$ (the current flow is through the trench poly) and a second element is the connection through a second bit-line (CB Bitline 2).

The first element actually does not add any additional parasitic resistance, since in normal operation the capacitor node is charged and discharged through this resistance path.

The second element 930 (CB Bitline 2) does add parasitic resistance on the order of 100's of ohms. This path is insignificant and can be ignored since the node (i.e., actual outdiffused buried strap connection) resistance is on the order of 5 to 10 k$\Omega$s.

Thus, the structure proposed in FIG. 9A is a universal sample test transistor that can be used for monitoring nominal array behavior of planar device/deep trench technology. This structure would also be applicable in any cell having the above mentioned features, or any stacked transistor cell employing a planar array transistor.

Figure 10:
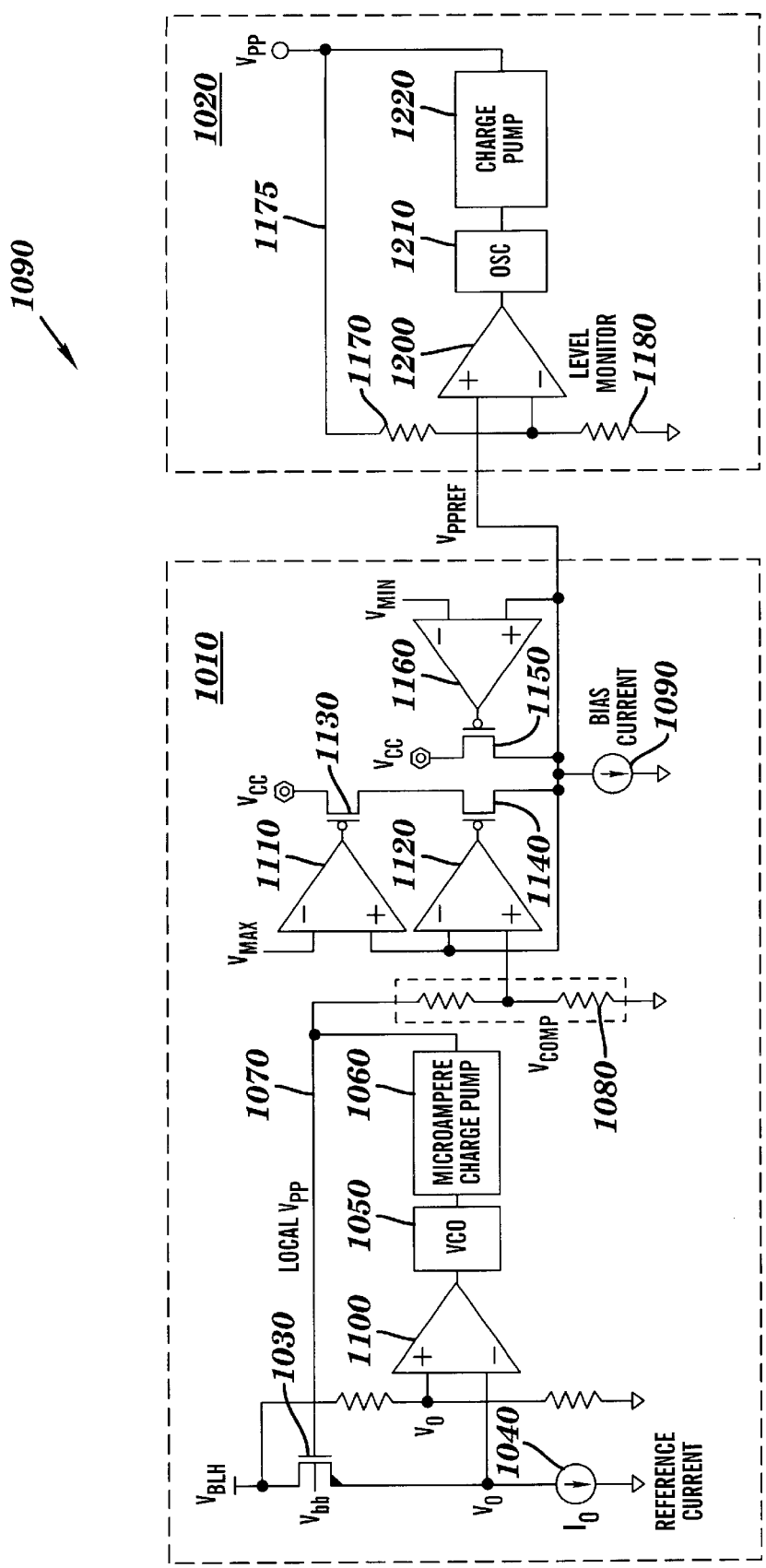
FIG. 10 is a partly schematic and partly block diagram illustration of an embodiment of the present invention.

Referring now to FIG. 10, another alternative embodiment of the disclosed invention is illustrated. FIG. 10 is a partly schematic and partly block diagram of a circuit 1090 which includes both 1) a compensated reference voltage $V_{ppref}$ system 1010, with maximum and minimum voltage limits, and 2) a word line voltage $V_{pp}$ regulation system 1020.

The compensated $V_{pp}$ reference voltage system 1010, with maximum and minimum voltage limits, includes a sample cell access device 1030. The source of sample cell access device 1030 is connected to a reference current source 1040, and also to a first input of an inverting amplifier 1100. The drain of sample cell access device 1030 is connected to a bitline "high" voltage source and to a second input of inverting amplifier 1100. The output of inverting amplifier 1100 is connected to a voltage controlled oscillator 1050. The output of voltage controlled oscillator 1050 is in turn connected to a microampere charge pump 1060. A feedback loop 1070 connects the output (which is a local word line voltage $V_{pp}$) of the microampere charge pump 1070, the gate of the sample cell access device 1030, and, via voltage comparator circuit 1080, to voltage limiting circuitry.

The voltage limiting circuitry sets the maximum and minimum voltage limits. This circuitry includes inverting amplifier and transistor pairs 1110, 1130, 1120, 1140; and 1150, 1160. A bias current source 1090 is also part of the voltage limiting circuitry. The output $V_{ppref}$ of the voltage limiting circuitry, is connected to the input of the word line voltage regulation system 1020.

The $V_{pp}$ word line voltage regulation system 1020 includes a resistor divider network composed of resistors 1170 and 1180, a level monitor amplifier 1200, an oscillator 1210, and a charge pump 1220. The $V_{pp}$ word line voltage regulation system 1020 receives its input $V_{ppref}$ from the output of the compensated $V_{pp}$ reference voltage system 1010 with maximum and minimum limits. The input $V_{ppref}$ is received by the level monitor amplifier 1200. The output of level monitor amplifier 1200 is connected to oscillator 1210. The oscillator's 1210 output is connected to charge pump 1220. The output of charge pump 1220 is connected to an output of the circuit as the word line voltage $V_{pp}$, and also forms a feedback loop 1175 as an input to level monitor amplifier 1200.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A method of biasing and monitoring a sample cell access device for regulating the word line selection voltage of a dynamic random access memory (DRAM) chip, said method comprising:
   (a) providing a sample cell access device wherein said sample cell access device substantially tracks the process parametric fluctuations of any one of a plurality of memory cell access devices within the DRAM chip;
   (b) forcing a constant DC current through said sample cell access device;
   (c) providing a DC voltage equal to the bitline selected voltage applied to a first terminal of said sample cell access device; and
   (d) providing an amplifying circuit connected between the gate terminal and a second terminal of said sample cell access device for regulating the voltage at the second terminal of said sample access device at a predetermined voltage greater than or less than the bitline selected voltage wherein said amplifying circuit outputs a reference voltage.

2. The reference voltage of claim 1, wherein said sample cell access device operates in a steady state DC condition.

3. The reference voltage of claim 1, wherein said reference voltage varies in response to process parametric fluctuations of said sample cell access device.

4. The reference voltage of claim 3, wherein said reference voltage is applied as an input reference voltage to a word line selection voltage generation system, and wherein said reference voltage controls the word line selection voltage.

5. The sample cell access device of claim 1, further comprising a single sample cell access device.

6. The sample cell access device of claim 1, further comprising a plurality of sample cell access devices connected in parallel.

7. The sample cell access device of claim 1, wherein when said DC voltage equal to the bitline voltage is applied to said first terminal of said sample cell access device, a voltage less than the bitline selected voltage is present at the second terminal of said sample cell access device.

8. The sample cell access device of claim 1, wherein when said DC voltage equal to the bitline voltage is applied to said second terminal of said sample cell access device, a voltage greater than the bitline selected voltage is present at the second terminal of said sample cell access device.

9. A word line voltage control circuit for monitoring a sample cell access device and regulating a word line voltage selection level of a dynamic random access memory (DRAM) cell, said word line voltage control circuit comprising:
   a sample cell access device;
   a circuit for forcing a fixed current through said sample cell access device;
   an amplifier circuit connected to the output of said sample cell access device;
   a feedback loop between said amplifier circuit and an input of said sample cell access device; and
   an output from said amplifier circuit to said word line of a dynamic random access memory (DRAM) cell.

10. The word line voltage control circuit of claim 9, wherein the sample cell access device operates in a steady state DC condition.

11. The word line voltage control circuit of claim 9, wherein said circuit for forcing a fixed current through said sample cell access device is a reference current source.

12. A method of employing a word line voltage control circuit for monitoring a sample cell access device and regulating a word line voltage selection level of a dynamic random access memory (DRAM), said method comprising:
   providing a word line voltage control circuit;
   providing a sample cell access device;
   forcing a fixed current through said sample cell access device;
   providing an amplifier circuit connected to the output of said sample cell access device;
   providing a feedback loop between said amplifier circuit and an input of said sample cell access device; and
   providing an output from said amplifier circuit to said word line of a dynamic random access memory (DRAM) cell.

13. The method of claim 12, wherein said sample cell access device operates in a steady state DC condition.

14. The method of providing a word line voltage control signal of claim 12, wherein a reference current source is used to force the fixed current through said sample cell access device.

15. A word line voltage control circuit for monitoring a sample cell access device and regulating a word line voltage selection level of a dynamic random access memory (DRAM) cell, said word line voltage control circuit comprising:
   a sample cell access device;
   a circuit for forcing a fixed current through said sample cell access device;
   an inverting amplifier connected to the output of said sample cell access device;
   a level monitor connected to the output of said inverting amplifier;
   a charge pump connected to the output of said level monitor;
   a feedback loop between said charge pump and an input of said sample cell access device; and
   an output from said feedback loop to said word line of a dynamic random access memory (DRAM) cell.

16. The word line voltage control circuit of claim 15, wherein the sample cell access device operates in a steady state DC condition.

17. The word line voltage control circuit of claim 15, wherein said circuit for forcing a fixed current through said sample cell access device is a reference current source.

18. The word line voltage control circuit of claim 15, wherein the charge pump comprises at least one charge pump.

19. A method of employing a word line voltage control circuit for monitoring a sample cell access device and regulating a word line voltage selection level of a dynamic random access memory (DRAM), said method comprising:
   providing a word line voltage control circuit;
   providing a sample cell access device;
   forcing a fixed current through said sample cell access device;
   providing an inverting amplifier connected to the output of said sample cell access device;
   providing a level monitor connected to the output of said inverting amplifier;
   providing a charge pump connected to the output of said level monitor;
   providing a feedback loop between said charge pump and an input of said level monitor; and
   providing an output from said feedback loop to said word line of a dynamic random access memory (DRAM) cell.

20. The method of providing a word line voltage control signal of claim 19, wherein the sample cell access device operates in a steady state DC condition.

21. The method of providing a word line voltage control signal of claim 19, wherein a reference current source is used to force the fixed current through said sample cell access device.

22. A dynamic random access memory (DRAM) word line supply comprising:
   (a) a voltage supply $V_{pp}$ increasing from a voltage level insufficient to enable a memory cell access transistor for the word line toward a voltage level sufficient to enable said access transistor, for connection to the word line from time to time;
   (b) the memory cell access transistor for connecting a memory cell capacitor to a bitline, having a gate connected to the word line;
   (c) a sample transistor similar to the memory cell access transistor;
   (d) a circuit for applying the increasing voltage supply to the sample transistor for causing the sample transistor to conduct, under voltage supply conditions similar to those required by the memory cell access transistor;
   (e) a circuit for prohibiting increase of the voltage supply upon turn-on of the sample transistor;
   whereby the voltage supply having the voltage level sufficient to turn-on the memory cell access transistor is provided for connection to the word line.

23. A word line supply as defined in claim 22 including a circuit for measuring current in the sample transistor comprised of a current mirror, whereby a feedback voltage resulting from mirrored current drawn by the sample transistor is provided for inhibiting said increase of the voltage supply.

24. A word line supply as defined in claim 22 in which the voltage supply is comprised of a charge pump and an oscillator for driving the charge pump, said circuit for inhibiting being comprised of a circuit for providing an inhibiting signal resulting from the drawing of current from said voltage supply by the sample transistor.

25. A word line voltage control circuit for monitoring and regulating a voltage signal to a word line of a dynamic random access memory (DRAM) cell, said word line voltage control circuit comprising:
   a compensated reference voltage system: and
   a word line voltage regulation system,
wherein the compensated reference voltage system further comprises:
   a sample cell access device operating in a steady state DC condition;
   a circuit for forcing a fixed current through said sample cell access device;
   an inverting amplifier connected to the output of said sample cell access device;
   a voltage controlled oscillator connected to the output of said inverting amplifier;
   a charge pump connected to the output of said voltage controlled oscillator;
   a feedback loop between said charge pump and an input of said level monitor;
   a voltage comparator connected to the output of said charge pump;
   a maximum voltage limiting circuit and minimum voltage limiting circuit connected to said voltage comparator; and
   an output from said voltage limiting circuits.

26. A word line voltage control circuit for monitoring a sample cell access device and regulating a word line voltage selection level of a dynamic random access memory (DRAM) cell, said word line voltage control circuit comprising:

a sample cell access device;

a comparator circuit for comparing a reference voltage output of the sample cell access device with a fixed reference voltage;

at least one charge pump connected to the output of said sample cell access device, said at least one charge pump receiving an input from said comparator circuit;

a feedback loop between said charge pump and an input of said sample cell access device; and an output from said feedback loop to said word line of a dynamic random access memory (DRAM) cell, wherein said comparator circuit further comprises a plurality of comparator circuits, wherein each comparator circuit is coupled to a reference voltage and to a charge pump.

27. The word line voltage control circuit of claim 26, wherein the sample cell access device operates in a steady state DC condition.

28. A word line voltage control circuit for monitoring and regulating a voltage signal to a word line of a dynamic random access memory (DRAM) cell, said word line voltage control circuit comprising:

a compensated reference voltage system; and a word line voltage regulation system, wherein the word line voltage regulation system further comprises:

an input from said compensated reference voltage system connected to a first input of a voltage level monitor;

an oscillator connected to the output of said voltage level monitor;

at least one charge pump connected to the output of said oscillator;

a feedback loop connected between the output of said charge pump and a second input of said voltage level monitor; and an output from said charge pump connected to said word line of a dynamic random access memory (DRAM) cell.

* * * * *